US009536711B2

(12) United States Patent
Dhindsa et al.

(10) Patent No.: US 9,536,711 B2
(45) Date of Patent: Jan. 3, 2017

(54) METHOD AND APPARATUS FOR DC VOLTAGE CONTROL ON RF-POWERED ELECTRODE

(75) Inventors: Rajinder Dhindsa, Fremont, CA (US); Eric Hudson, Fremont, CA (US); Alexei Marakhtanov, Fremont, CA (US); Maryam Moravej, Fremont, CA (US); Andreas Fischer, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 662 days.

(21) Appl. No.: 12/047,820

(22) Filed: Mar. 13, 2008

(65) Prior Publication Data

US 2008/0241420 A1    Oct. 2, 2008

Related U.S. Application Data

(60) Provisional application No. 60/909,343, filed on Mar. 30, 2007.

(51) Int. Cl.
*H01J 37/32* (2006.01)

(52) U.S. Cl.
CPC .... *H01J 37/32642* (2013.01); *H01J 37/32091* (2013.01); *H01J 37/32174* (2013.01); *H01J 37/32623* (2013.01); *H01J 37/32697* (2013.01)

(58) Field of Classification Search
USPC ...... 427/569; 118/723 I, 723 IR; 156/345.48
See application file for complete search history.

(56) References Cited

U.S. PATENT DOCUMENTS

| 5,575,887 A | 11/1996 | Yoshida et al. ............ 156/643.1 |
| 5,858,471 A | 1/1999 | Ray et al. |
| | (Continued) | |

FOREIGN PATENT DOCUMENTS

| EP | 0875919 A2 | 4/1998 | ............ H01J 37/32 |
| JP | 56090978 | 7/1981 | |
| | (Continued) | | |

OTHER PUBLICATIONS

Zeuner et al., "Ion energy distributions in a dc biased rf discharge", Journal of Applied Physics vol. 81 Issue 7, 1997.*

(Continued)

*Primary Examiner* — Dah-Wei D Yuan
*Assistant Examiner* — Jose Hernandez-Diaz
(74) *Attorney, Agent, or Firm* — Martine Penilla Group, LLP

(57) ABSTRACT

In a plasma processing chamber, a method for processing a substrate is provided. The method includes supporting the substrate in the plasma processing chamber configured with an upper electrode (UE) and a lower electrode (LE), configuring at least one radio frequency power source to ignite plasma between the UE and the LE, and providing a conductive coupling ring, the conductive coupling ring is coupled to the LE to provide a conductive path. The method further includes providing a plasma-facing-substrate-periphery (PFSP) ring, the PFSP ring being disposed above the conductive coupling ring. The method yet further includes coupling the PFSP ring to at least one of a direct current (DC) ground through an RF filter, the DC ground through the RF filter and a variable resistor, a positive DC power source through the RF filter, and a negative DC power source through the RF filter to control plasma processing parameters.

20 Claims, 8 Drawing Sheets

(56) References Cited

U.S. PATENT DOCUMENTS

| | | | |
|---|---|---|---|
| 5,942,039 A | 8/1999 | Kholodenko et al. | 118/723 |
| 6,383,931 B1 | 5/2002 | Flanner et al. | 438/689 |
| 6,464,794 B1 | 10/2002 | Park et al. | 118/728 |
| 6,653,734 B2 | 11/2003 | Flanner et al. | 257/758 |
| 6,797,109 B2 | 9/2004 | Park et al. | 156/345.37 |
| 7,740,737 B2 | 6/2010 | Koshiishi et al. | 156/345.44 |
| 7,951,262 B2 | 5/2011 | Koshiishi et al. | 156/345.44 |
| 7,988,814 B2* | 8/2011 | Koshiishi | 156/345.43 |
| 7,988,816 B2 | 8/2011 | Koshiishi et al. | 156/345.47 |
| 8,056,503 B2 | 11/2011 | Kikuchi et al. | 118/723 E |
| 8,137,471 B2 | 3/2012 | Koshiishi et al. | 118/730 |
| 8,387,562 B2 | 3/2013 | Kikuchi et al. | 118/723 E |
| 2002/0022281 A1 | 2/2002 | Flanner et al. | 438/8 |
| 2003/0000459 A1 | 1/2003 | Park et al. | 117/200 |
| 2003/0000648 A1 | 1/2003 | Park et al. | 156/345.51 |
| 2003/0013315 A1 | 1/2003 | Park et al. | 438/710 |
| 2003/0045101 A1 | 3/2003 | Flanner et al. | 438/689 |
| 2003/0205327 A1* | 11/2003 | Howald et al. | 156/345.28 |
| 2004/0027781 A1 | 2/2004 | Hanawa et al. | 361/234 |
| 2004/0177927 A1 | 9/2004 | Kikuchi et al. | 156/345.51 |
| 2005/0103275 A1* | 5/2005 | Sasaki et al. | 118/728 |
| 2005/0133164 A1* | 6/2005 | Fischer et al. | 156/345.51 |
| 2006/0037701 A1 | 2/2006 | Koshiishi et al. | 156/345.44 |
| 2006/0037703 A1 | 2/2006 | Koshiishi et al. | 156/345.47 |
| 2006/0043067 A1* | 3/2006 | Kadkhodayan et al. | 216/67 |
| 2006/0066247 A1* | 3/2006 | Koshiishi et al. | 315/111.21 |
| 2006/0278341 A1 | 12/2006 | Park et al. | 156/345.51 |
| 2010/0126668 A1 | 5/2010 | Koshiishi et al. | 156/345.47 |
| 2011/0214815 A1 | 9/2011 | Koshiishi et al. | 156/345.38 |
| 2011/0272097 A1 | 11/2011 | Koshiishi et al. | 156/345.24 |
| 2012/0006492 A1 | 1/2012 | Kikuchi et al. | 156/345.51 |
| 2013/0174983 A1 | 7/2013 | Kikuchi et al. | 156/345.28 |

FOREIGN PATENT DOCUMENTS

| | | | |
|---|---|---|---|
| JP | 61139685 | 6/1986 | |
| JP | H07254588 A | 10/1995 | C23C 16/50 |
| JP | 09-120957 A | 5/1997 | |
| JP | 12-243707 A | 9/2000 | |
| JP | 15-234340 A | 8/2003 | |
| TW | 376531 | 12/1999 | H01L 21/00 |

OTHER PUBLICATIONS

Impedance ( 2008 Columbia Encyclopedia. Retrieved from http://www.credoreference.com/entry/coluency/impedance).*

Ground. (2001). In Hargrave's Communications Dictionary, Wiley. Retrieved from http://www.credoreference.com/entry/hargravecomms/ground.*

Switch. (2009). In the Penguin Dictionary of Physics. Retrieved from http://www.credoreference.com/entry/pendphys/switch.*

"International Prelirrninany Report on Patentability", issued in PCT Application No. PCT/US2008/058315; Mailing Date: Oct. 15, 2009.

"International Search Report", Issued in PCT Application No. PCT/US2008/058316; Mailing Date: Aug. 21, 2008.

"Written Opinion", Issued in PCT Application No. PCT/US2008/058316; Mailing Date: Aug. 21, 2008.

"Search and Examination Report", Singapore Patent Application No. 200906414-8, Mailing Date: Nov. 4, 2011.

"First Office Action", Chinese Patent Application No. 200880011076.7, Mailing Date: Jul. 28, 2011.

Taiwan Search Report, 103121047, p. 7 from Examination Opinions, Mar. 11, 2015.

* cited by examiner

METHOD AND APPARATUS FOR DC VOLTAGE CONTROL ON RF-POWERED ELECTRODE

BACKGROUND OF THE INVENTION

Advances in plasma processing have facilitated growth in the semiconductor industry. The semiconductor industry is a highly competitive market. The ability for a manufacturing company to be able to process substrate in different processing conditions may give the manufacturing company an edge over the competitor. Thus, manufacturing companies have dedicated time and resources to identify methods and/or arrangements for improving substrate processing.

A typical processing system that may be employed to perform substrate processing may be an asymmetrical multi-frequency capacitively coupled processing system. The processing system is built to enable processing in a range of process parameters. However, in recent years, the types of devices that are being processed have become more sophisticated and may required more process control. In an example, devices being processed are becoming smaller and may require more precise processing.

Given the needs to stay competitive in the semiconductor industry, enhancements to the capabilities of capacitively coupled plasma processing system are highly desirable.

SUMMARY OF INVENTION

The invention relates, in an embodiment, to a method for processing a substrate in a plasma processing chamber. The method includes supporting the substrate in the plasma processing chamber configured with an upper electrode and a lower electrode. The method also includes configuring at least one radio frequency (RF) power source to ignite plasma between the upper electrode and the lower electrode. The method further includes providing a conductive coupling ring. The conductive coupling ring is coupled to the lower electrode to provide a conductive path. The method yet also includes providing a plasma-facing-substrate-periphery (PFSP) ring, the PFSP ring being disposed above the conductive coupling ring. The method yet further includes coupling the PFSP ring to at least one of a direct current (DC) ground through an RF filter, the DC ground through the RF filter and a variable resistor, a positive DC power source through the RF filter, and a negative DC power source through the RF filter to control plasma processing parameters.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by ways of limitation, in the figures of the accompanying drawings and in which like reference numerals refer to similar elements and in which.

DETAILED DESCRIPTION OF EMBODIMENTS

Figure 1:
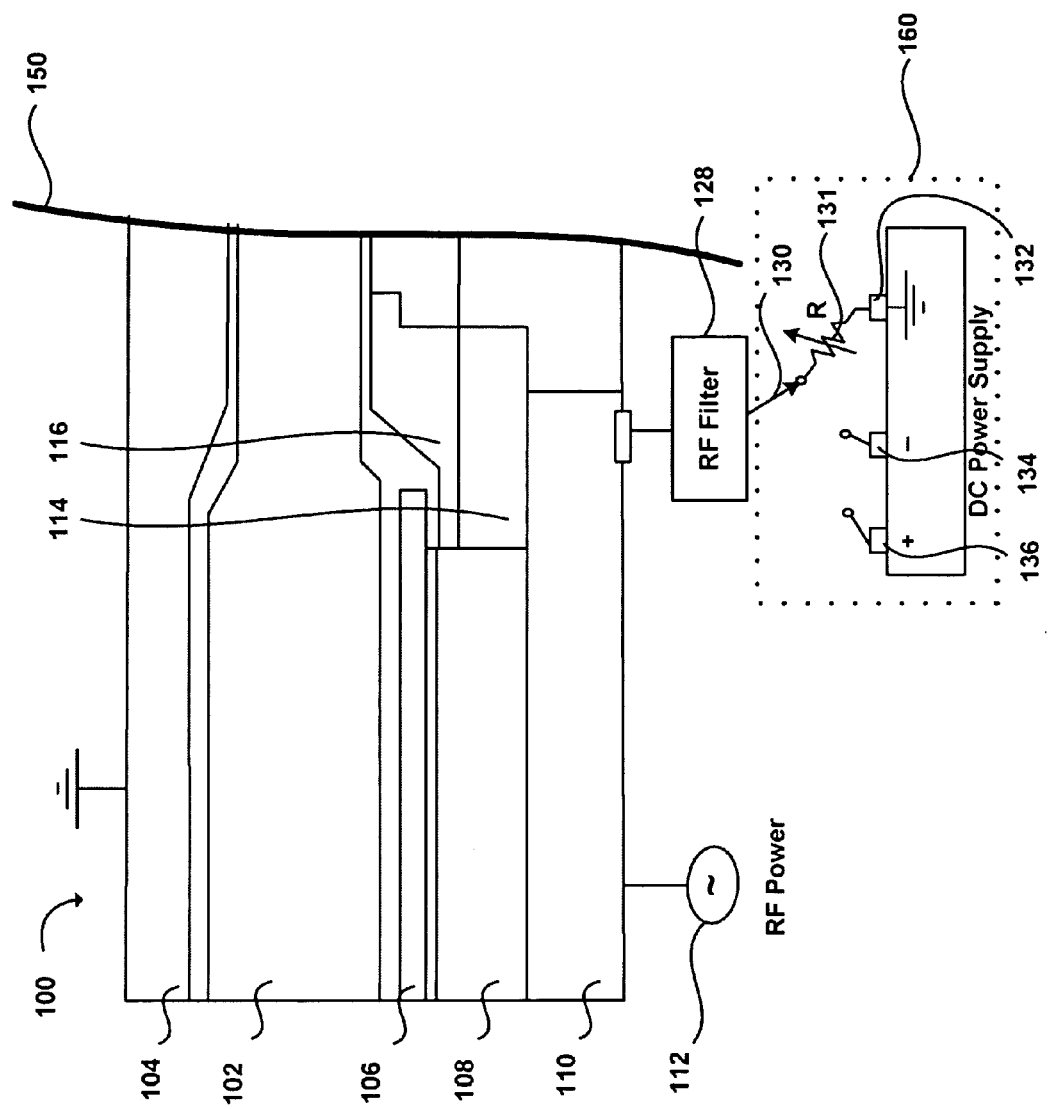
FIG. 1 shows, in accordance with an embodiment of the present invention, a simplified schematic of a capacitively-coupled plasma processing system configured with components designed to enhance control over the plasma processing system.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, there are provided methods and arrangements for configuring a plasma processing system to enhance control over plasma processing parameters. Embodiments of the invention include employing a plasma-facing substrate-periphery (PFSP) ring couple to a DC control module to enable more control over the parameters. With more sophisticated controls: the process regime of the plasma processing system may be expanded to allow for substrate processing beyond traditional processing parameters.

In an embodiment, the plasma processing system may be configured to include a conductive coupling ring to provide a conductive path between a plasma-facing substrate-periphery ring and a DC control module. In an embodiment a DC control module may include a switch, a positive DC power supply, a negative DC power source, and a variable resistor being connect to a DC ground. By providing a conductive path, plasma-processing parameters (e.g., mean ion energy and/or plasma density) may be controlled by DC control module.

In an example, plasma-processing parameters may be controlled by coupling PFSP ring to ground through RF filter. In another example, plasma-processing parameters may also be controlled by coupling PFSP ring to ground through RF filter and a variable resistor. In yet another example, plasma-processing parameters may be controlled b coupling PFSP ring to a positive DC voltage source through RF filter. In yet another example, plasma-processing parameters may be controlled by coupling PFSP ring to a negative DC voltage source through RF filter.

In another embodiment, the plasma processing system may be configured to include a DC conductive coupling ring to provide a DC conductive path between a plasma-facing substrate-periphery (PFSP) ring, not limited to a hot edge ring, and a DC control module without eliminating the plasma processing system's ability to create an RF conductive coupling with the hot edge ring In another embodiment, the plasma processing system may be configured to provide a DC conductive path while maintaining the ability to create an RF conductive coupling. RF conductive coupling may be configured by employing an RF coupling ring to couple an electrostatic chuck to a hot edge ring. In order to achieve DC conductive coupling without eliminating RF conductive coupling, additional rings, such as a DC conductive coupling ring and a PFSP ring, may be employed to provide the DC conductive path. In an embodiment, the PFSP ring may be any type of plasma-facing rings that may be on the periphery of the substrate.

The features and advantages of the invention may be better understood with reference to the figures and discussions that follow.

FIG. 1 shows, in accordance with an embodiment of the present invention, a simplified schematic of a capacitively-coupled plasma processing system 100 configured with components designed to enhance control over the plasma processing system. Plasma processing system 100 may be a single, double, or triple frequency capacitively discharged system. In an example, radio frequencies (RFs) may include, but are not limited to, 2, 27 and 60 MHz.

Plasma processing system 100 may be asymmetrical in that a grounded upper electrode 104 may have a different diameter (e.g., larger) than the diameter of a substrate 106 and/or an electrostatic chuck 108. Accordingly, during plasma processing the potential, being measured in direct current voltage ($V_{dc}$), of grounded upper electrode 104 may differ from that of substrate 106. In an example, the $V_{dc}$ of grounded upper electrode 104 may be zero whereas the $V_{dc}$ of substrate 106 tends to be negative.

Plasma processing system 100 may also be configured to include a grounded upper electrode 104 and a lower electrode, such as an electrostatic chuck 108, disposed above a lower body 110, which is usually aluminum. Electrostatic chuck 108 may be constructed from aluminum with a ceramic dielectric layer on the surface of the aluminum plate.

Plasma processing system 100 may also include a radio frequency (RF) generator 112 to supply RF bias power to electrostatic chuck 108 through lower body 110. Usually, RF power 112 may interact with a gas (not shown to simplify schematic) to ignite plasma 102 between upper electrode 104 and electrostatic chuck 108. Plasma 102 may etch and/or deposit materials onto substrate 106 to create electronic devices.

Plasma processing system 100 may also include a coupling ring 114. In an embodiment, arranged above coupling ring 114 is a plasma-facing-substrate-periphery (PFSP) ring 116, which may be disposed on the periphery of the substrate facing plasma 102. PFSP ring 116 may include, but are not limited to, a hot edge ring. PFSP ring 116 may be employed to provide protection for the underlying components, such as coupling ring 114, from being damage by the ions of plasma 102. PFSP ring 116 may also be utilized to focus the ions of the plasma at the edge of a substrate to maintain process uniformity during plasma processing in a capacitively coupled plasma processing system.

In the prior art, the coupling ring may be constructed of an RF conductive material, such as quartz, to enable RF coupling between electrostatic chuck 108 and PFSP ring 116. In contrast to prior art, coupling ring 114 may be constructed of a DC conductive material, such as aluminum, to provide DC coupling between and PFSP ring 116 and lower body 110. In an example, coupling ring 114 may provide a conductive path that may enable a current to traverse from upper electrode 104, through plasma 102, through PFSP ring 116, through lower body 110, through an RF filter 128 to DC control module 160. By enabling DC coupling, a DC current path may be established with an external DC control module 160.

In an embodiment, DC control module 160 may include a switch 130, a positive DC power supply 136, a negative DC power source 134, and a DC ground 132. A variable resistor 131 may be configured to connect to DC ground 132 in order to vary the resistance of the DC current path.

Driving the current along the aforementioned conductive path may be achieved through different implementations.

DC control module 160 may be employed to control a plurality of plasma processing parameters. In an embodiment, a current may be driven along the aforementioned conductive path through PFSP ring 116 by coupling lower body 110 with RF filter 128 to switch 130 of DC control module 160 to connect to DC ground 132. RF filter 128 is generally employed to provide attenuation of unwanted harmonic RF energy without introducing losses to DC power source. Unwanted harmonic RF energy is usually generated in the plasma discharge and may be kept from being returned to the DC power source by RF filter 128.

Switch 130 is generally employed to select between various DC external power sources. In an example, when switch 130 is opened, a current path does not exist to an external DC control module. Therefore, the substrate DC bias voltage ($V_{dc}$) as aforementioned will tend to be negative in relation to the plasma due to the asymmetric plates. However, when switch 130 is closed and the circuit is grounded, the substrate DC bias tends to go from negative to zero.

Upon closing switch 130 to drive the voltage on PFSP ring 116 toward ground, the plasma voltage potential ($V_{pl}$) and substrate DC bias ($V_{dc}$) may change. While not wishing to be bound by theory, the inventors believe that mean ion energy to the substrate ($E_{mean}$) may be correlated to $V_{pl}$ and $V_{dc}$ by Equation 1:

$$E_{mean}=V_{pl}-V_{dc}$$   Equation 1

Generally, the mean ion energy to a substrate in a capacitively coupled plasma processing system may be determined by the potential difference established in a plasma-processing chamber. In an example, the mean ion energy to substrate 106 tends to change, depending on the specific changes in values of $V_{pl}$ and $V_{dc}$, upon closing the circuit with a path to DC ground.

Furthermore, the plasma density tends to increase when switch 130 is closed and a DC current path to ground is established with PFSP ring 116. The increase in plasma density tends to be global in an advantageous manner. As the term is employed herein, global refers to the uniform increase in plasma density not only across the substrate but also beyond the substrate edge. Accordingly, plasma density does not tend to drop off at the edge of the substrate. In general, it is desirable for the plasma density to remain substantially constant over the entire surface of the substrate in order to maintain process uniformity and vertical etch profiles.

In yet another embodiment, DC control module 160 may be employed to drive the current through PFSP ring 116 by coupling lower body 110 with RF filter 128 to variable resistor 131 to connect to DC ground 132. Upon closing switch 130, the current flowing through the circuit path may be regulated by changing the value of variable resistor 131 to affect the voltage potentials at the substrate and plasma. Thus, mean ion energy and plasma density values between floating and ground may also be adjusted, i.e., fine-tuned.

Consider the situation wherein, for example, switch 130 is closed and is in contact with positive DC voltage bias 134. The current may be driven through PFSP ring 116 by coupling lower body 110 with RF filter 128 by a positive DC voltage bias 136, in an embodiment. The limit for bias DC voltage 136 may be the plasma potential. By increasing bias DC voltage 136, the voltage potentials of the substrate and the plasma may increase, the plasma density may increase, and the mean ion energy may decrease beyond the ground state.

Consider the situation wherein, for example, switch 130 is closed and is in contact with negative DC voltage bias 134. The current may be driven through PFSP ring 116 by coupling lower body 110 with RF filter 128 by a negative DC voltage bias 134, in an embodiment. The limit to the negative DC voltage bias value may be based on the substrate DC bias. By controlling the negative DC voltage bias 134, the voltage potentials of the substrate and the plasma may decrease. By reducing the plasma potential, the capability of maintaining confined plasma may be improved. In addition, by controlling the negative DC voltage bias 134, plasma density may decrease and the mean ion energy may increase.

As shown in FIG. 1, enhanced control of the plasma processing parameters may be achieved by manipulating the DC control module. Therefore, capacitively-coupled plasma processing system with asymmetrical plates are now able to perform more sophisticated substrate processing that may be outside of the traditional plasma processing regime. In addition, the cost of ownership to the manufacturing companies may be minimized since the implementation of the embodiments is relatively simple and inexpensive.

Figure 2:
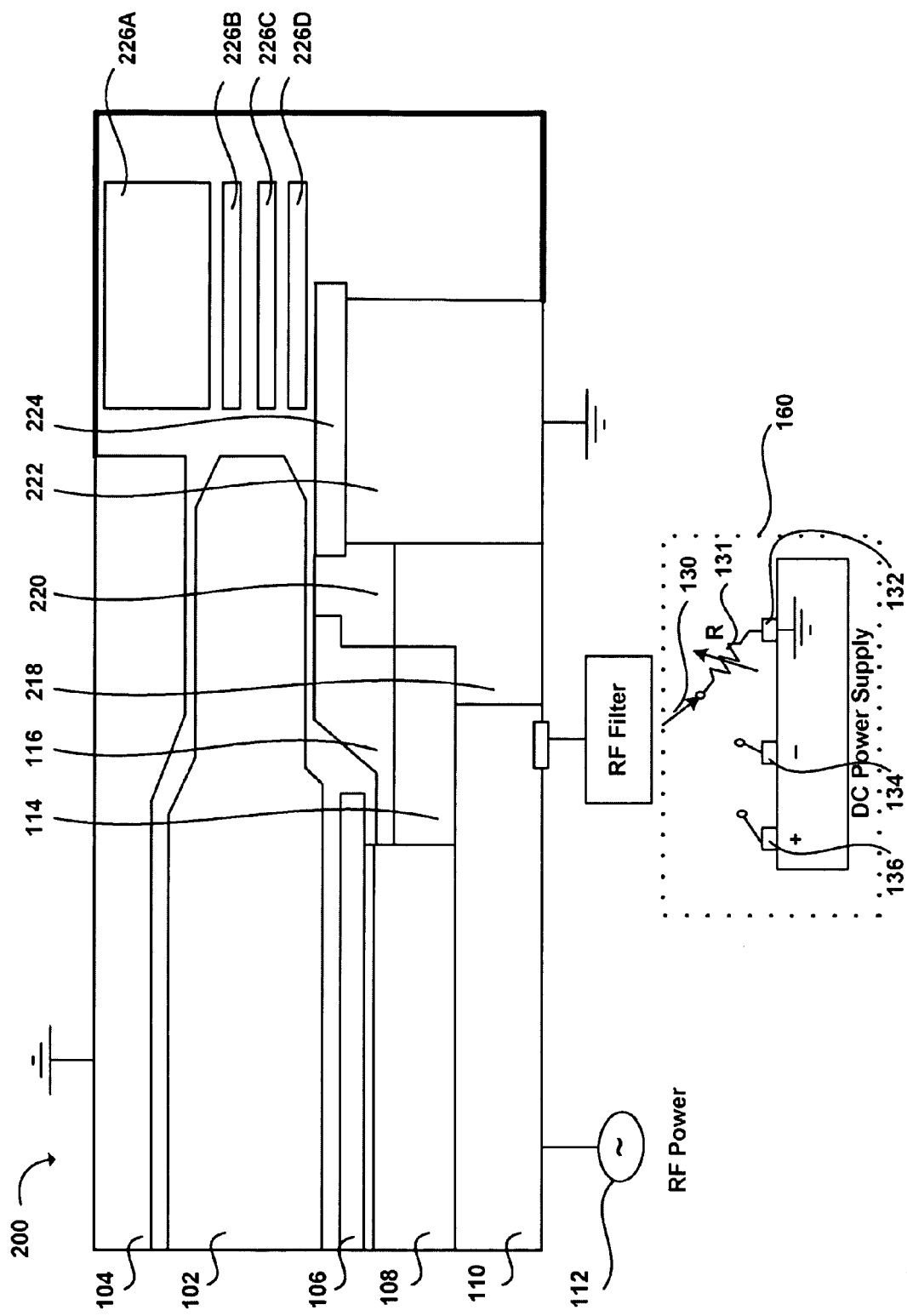
FIG. 2 shows, in accordance with an embodiment of the present invention, a simplified schematic of a capacitively-coupled plasma processing system configured with components designed to enhance control over the plasma processing system.

FIG. 2 shows, in accordance with an embodiment of the present invention, a simplified schematic of a capacitively-coupled plasma processing system 200 configured with components designed to enhance control over the plasma processing system. Note that FIG. 2 shows the implementation of plasma processing system 100 of FIG. 1 with additional elements to the right of a line 150 of FIG. 1.

Plasma processing system 200 may include a bottom insulator 218 typically made out of quartz. Disposed on top of bottom insulator 218 is a bottom insulator cover 220 that may also made out of quartz. Coupled to the bottom insulator cover 220 is a bottom ground extension 222. The bottom ground extension 222 is typically made out of aluminum and is grounded. Disposed above bottom ground extension 222 is a cover ring 224 that is typically made out of quartz.

Multi-frequency capacitively coupled plasma processing system 200 also includes a plurality of confinement rings (226A, 226B, 226C, and 226D). The confinement rings 226A-226D function to confine plasma within plasma chamber during plasma processing.

Plasma processing system 200 may also benefit from embodiments described in FIG. 1. By configuring plasma processing system 200 with a conductive path to DC control module, the capacitively-coupled plasma processing system is now able to perform more sophisticated substrate processing that may be outside of the traditional plasma processing regime.

Figure 3:
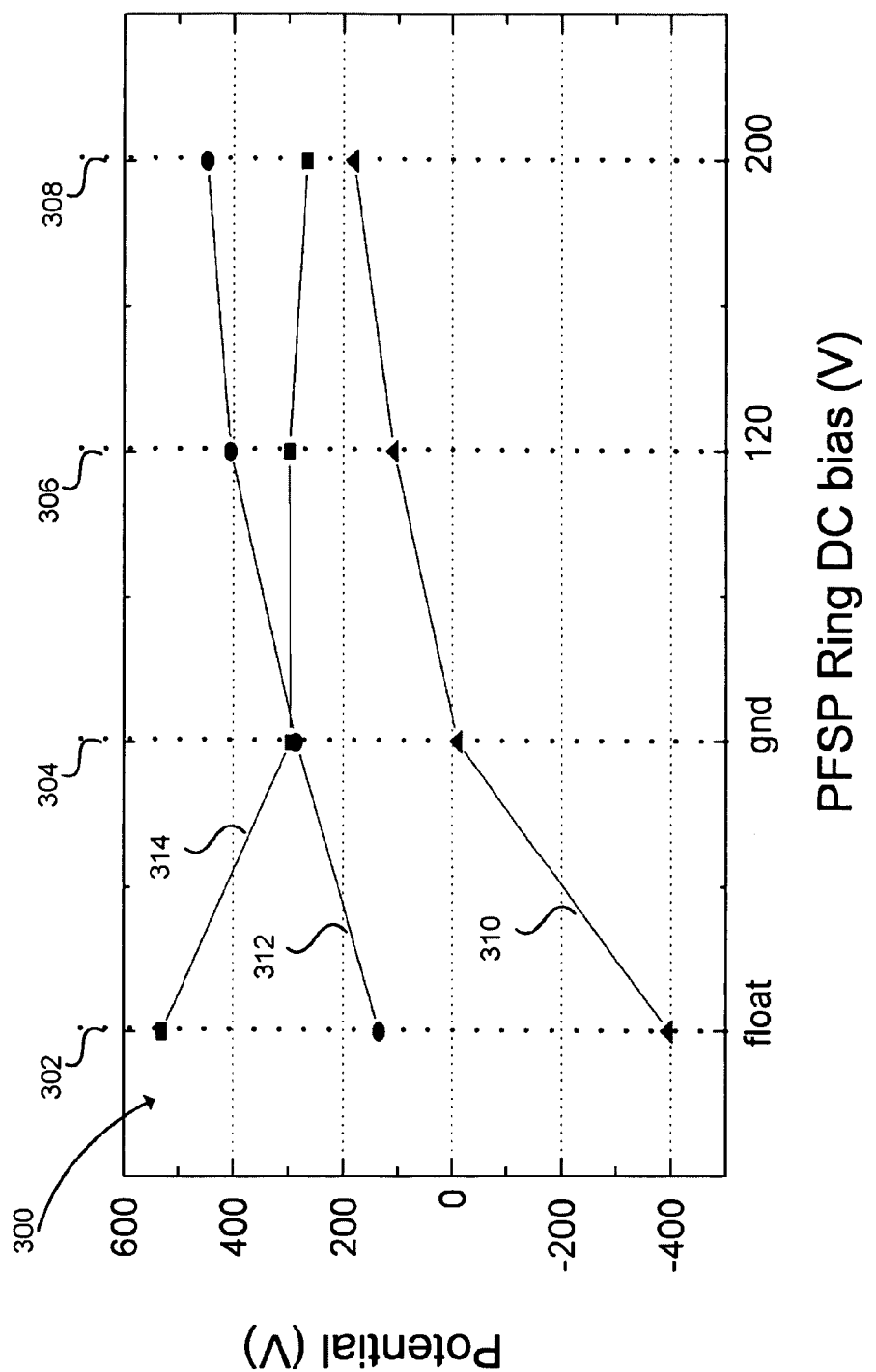
FIG. 3 shows, in accordance with an embodiment, a graph representing data showing the measured potentials as a function of DC bias on a PFSP ring (e.g., hot edge ring).

As discussed above, mean ion energy to a substrate in a capacitively coupled plasma processing system may be determined by the potentials established in a plasma-processing chamber. The potentials may include, but are not limited to, plasma potential, floating potential, and/or potential of powered or externally biased electrode. FIG. 3 shows, in accordance with an embodiment, a graph 300 representing data showing the measured potentials as a function of DC bias on a PFSP ring (e.g., hot edge ring). FIG. 3 is discussed in relation to FIGS. 1 and 3 to facilitate understanding.

The vertical axis shows measured potentials in voltage (V) and the horizontal axis shows different DC bias voltage (V) settings on the PFSP ring. Along the horizontal axis, four different conditions (302, 304, 306, and 308) for the DC bias on the PFSP ring are shown.

Mapped on graph 300 are three plots lines (310, 312, and 314). Plot line 310 shows an example of the substrate DC bias, $V_{dc}$. Plot line 312 shows an example of the plasma potential, $V_{pl}$. Plot line 314 shows an example of the mean ion energy at the substrate, $E_{mean}$.

Consider the situation wherein, for example, dual frequencies RF power, such as 2 and 27 MHz, may be applied by RF generator 112. During processing, switch 130 is opened. On graph 300, the opened condition of switch 130 is shown as condition line 302. When switch 130 is opened, substrate 106 may have a negative DC bias voltage ($V_{dc}$), as shown by plot line 310. In addition, the voltage potential ($V_{pl}$) of plasma 102 may be higher than the substrate DC bias voltage ($V_{dc}$), as shown by plot line 312. Due to the asymmetry of the capacitively coupled plasma processing system, the plasma voltage potential ($V_{pl}$) tends to be higher than substrate DC bias voltage ($V_{dc}$) as illustrate by plot lines 312 and 310, respectively, at condition line 302.

When switch 130 is closed, for example, PFSP ring 116 becomes grounded when a conductive current path is established between conductive coupling ring 114 and lower body 110 to external DC control module 160. On graph 300, the ground condition of PFSP ring 116 may be shown as condition line 304. Since substrate 106 and plasma 102 both exist along the conductive current path, the substrate DC bias ($V_{dc}$) and the plasma voltage potential ($V_{pl}$) may increase when DC current path is connected to ground. In an example, the substrate DC bias ($V_{dc}$) may increase from a negative potential to a potential of about zero. As can be seen, plot line 310 has shown an increase as the substrate DC bias ($V_{dc}$) increase from a negative potential to about zero. Similarly, plot line 312 has also shown an increase however, the increase is not as steep since the change in the plasma voltage potential is less than that of the substrate DC bias voltage.

As aforementioned, the mean ion energy in a capacitively coupled plasma processing system may be determined by the potential difference established in a processing chamber. In an example, when switch 130 is opened, $V_{dc}$ tends to be negative. However, when switch 130 is closed and the circuit is grounded, the substrate DC bias tends to go from negative to zero. Since the increased to plasma voltage potential is less than the increased to substrate DC bias voltage, the mean ion energy $E_{mean}$ at the substrate tends to decrease. As can be seen, plot line 314 has shown a decrease in the mean ion energy at substrate 106.

The voltage potential values of the substrate and/or plasma, as shown by plot lines 310 and 312, respectively may be manipulated (e.g., fine-tuned). In an embodiment, variable resistor 131 may be placed along the conductive current path to control the resistant value, thereby controlling the voltage potential. As a result, the mean ion energy at the substrate, as shown by plot line 314, may also be controlled.

In an example, condition lines 306 and 308 show positive 120 volts and positive 200 volts, respectively, of DC bias on PFSP ring 116. Plot line 310 shows a slight increase in substrate DC bias from condition line 304 to condition line 306, where DC bias to PFSP ring 116 is about 120 V. Plot line 310 may start to plateau out with further increase in DC bias voltage as it approaches condition line 308, where DC bias is about 200 V. The upper limit for the bias DC voltage on PFSP 116 may be the plasma potential.

Analogously, plot line 312 shows a slight increase in plasma potential and continues to plateau in plasma potential value at condition lines 306 and 308, respectively. Correspondingly, the mean ion energy at the substrate, as shown by plot line 314 of FIG. 3, shows a minimal decrease in value and continues to plateau off.

As can be seen from FIG. 3, graph 300 shows that the implementation of a DC control module may enhance control over parameters of the processing environment, such as the DC bias of the substrate, the plasma potential, and the mean ion energy at the substrate. In an example, by controlling DC voltage to the PFSP ring, voltage potentials of the substrate and/or the plasma may be impacted. Also, the mean ion energy at the substrate may be controlled by fine-tuning the potentials between floating and ground through configuring a variable resistor in the current path. Furthermore, the DC effect may continue and may plateau off as positive DC bias at PFSP ring approaches the limit, i.e., plasma potential.

Figure 4:
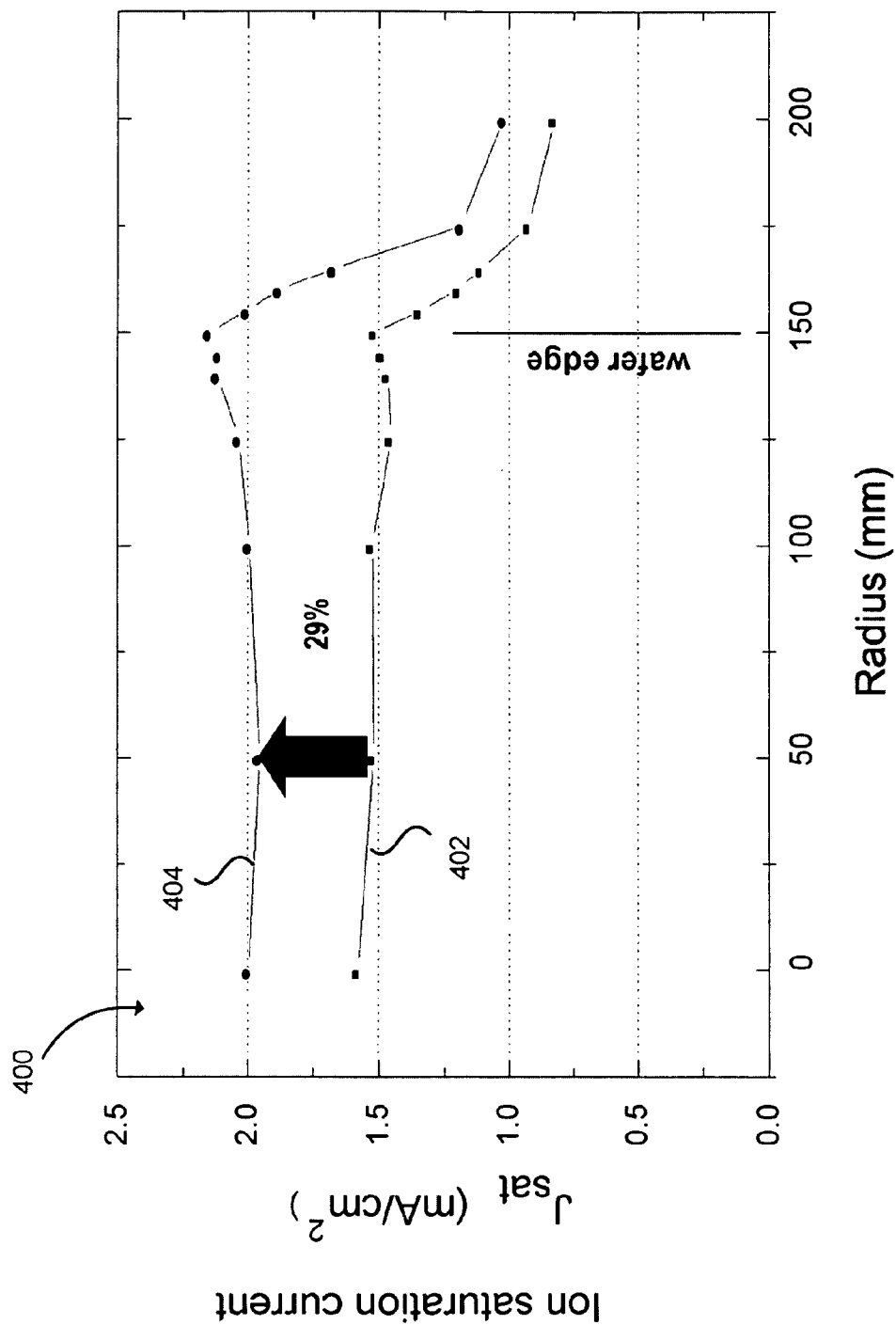
FIG. 4 shows, in accordance with an embodiment of the invention, a graph representing data illustrating the ion saturation current density along the radius of the substrate.

FIG. 4 shows, in accordance with an embodiment of the invention, a graph 400 representing data illustrating the ion saturation current density along the radius of the substrate. The vertical axis shows ion saturation current density, $J_{sat}$, measured milliampere per square centimeter (mA/cm$^2$). The horizontal axis shows distance in millimeter (mm) from the center of a substrate. Along the horizontal axis, the center of the substrate is where the radius is about zero. In an example, for a 300 mm diameter substrate, the edge of the substrate is where the radius is about 150 mm.

Graph 400 may include plot lines 402 and 404. Plot line 402 shows an example of an ion flux, i.e., plasma density, across the substrate in which the switch is opened (i.e., no current path to the DC control module). Plot line 404 shows an example of an ion flux across the substrate in which the switch is closed and a current path to the DC control module exists.

Consider the situation wherein, for example, a switch is closed during plasma processing. As a result, the plasma density across the substrate may increase uniformly across the substrate as shown by plot lines 402 and 404. As aforementioned, the increase may be a global increase with the plasma density increasing uniformly across the substrate and beyond the substrate edge.

Figure 5:
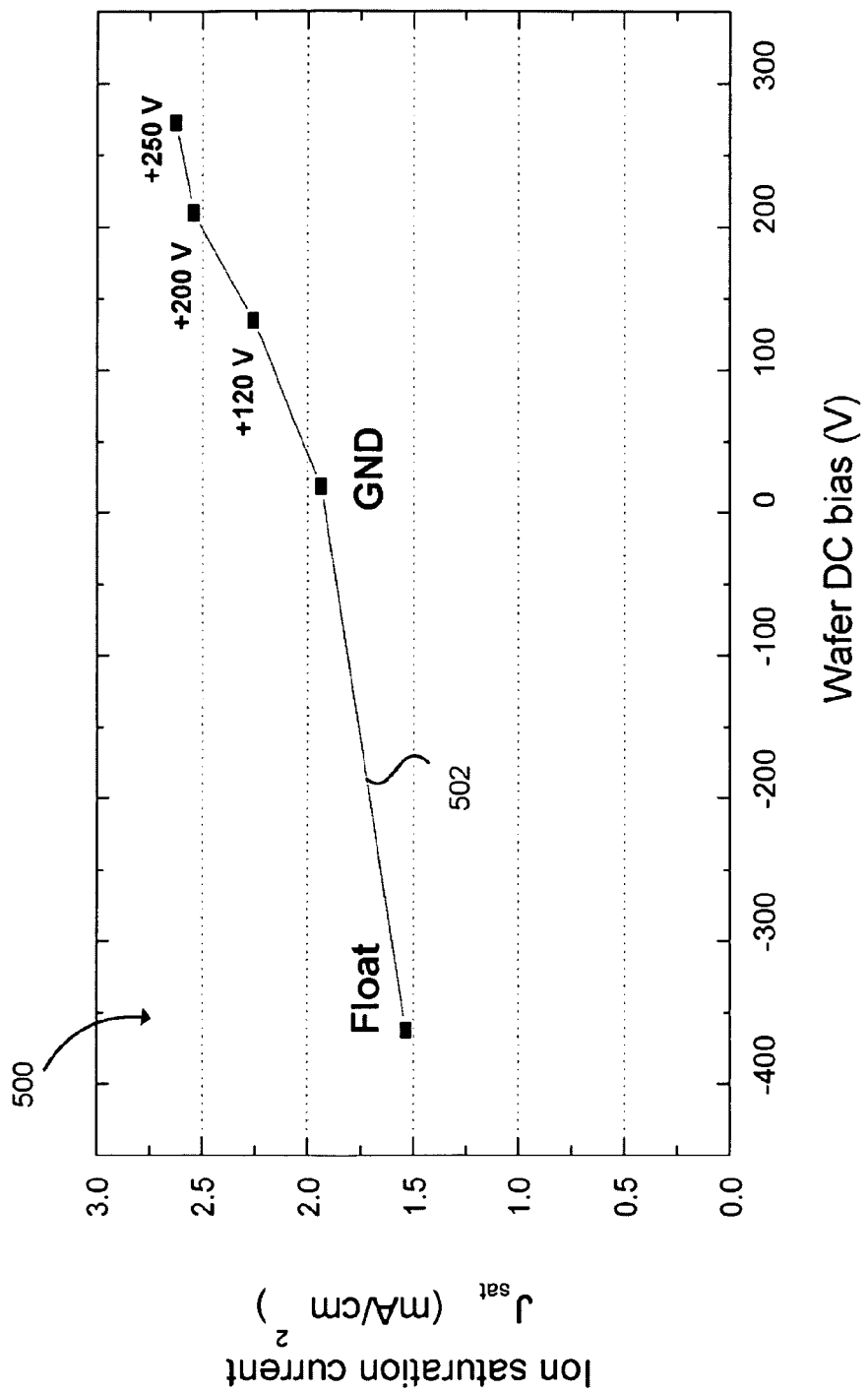
FIG. 5 shows, in accordance with an embodiment of the invention, a graph representing data showing the ion saturation current density as a function of DC bias on the substrate.

FIG. 5 shows, in accordance with an embodiment of the invention, a graph 500 representing data showing the ion saturation current density as a function of DC bias on the substrate. The vertical axis shows ion saturation current density, $J_{sat}$, measured milli-ampere per square centimeter (mA/cm$^2$). The horizontal axis shows substrate DC bias measured in voltage (V).

In an embodiment, a plot line 502 shows plasma density increases when a current path to DC control module goes from floating to ground. The plasma density value between floating to ground may be control with a variable resistor configured in the current path of the DC ground. In addition, plot line 502 shows the ion saturation current increases with an increasing positive voltage DC bias, e.g., +120 V. +200V and +250 V, and the effect gradually levels off due to plasma potential limit.

In general, a DC sheath tends to develop at the ground electrode as DC potential is increased above floating potential. As the term is employed herein, floating potential refers to the potential assumed by a surface within an asymmetrically capacitively coupled plasma processing system that is not externally bias or grounded. The presence of a DC sheath opposite the substrate tends to trap energetic secondary electrons. The trapping of energetic secondary electrons tends to cause an increase in plasma density due to relatively high cross section for ionization by energetic electrons. Thus, plasma density across the substrate may be manipulated by controlling DC bias to the substrate.

Figure 6:
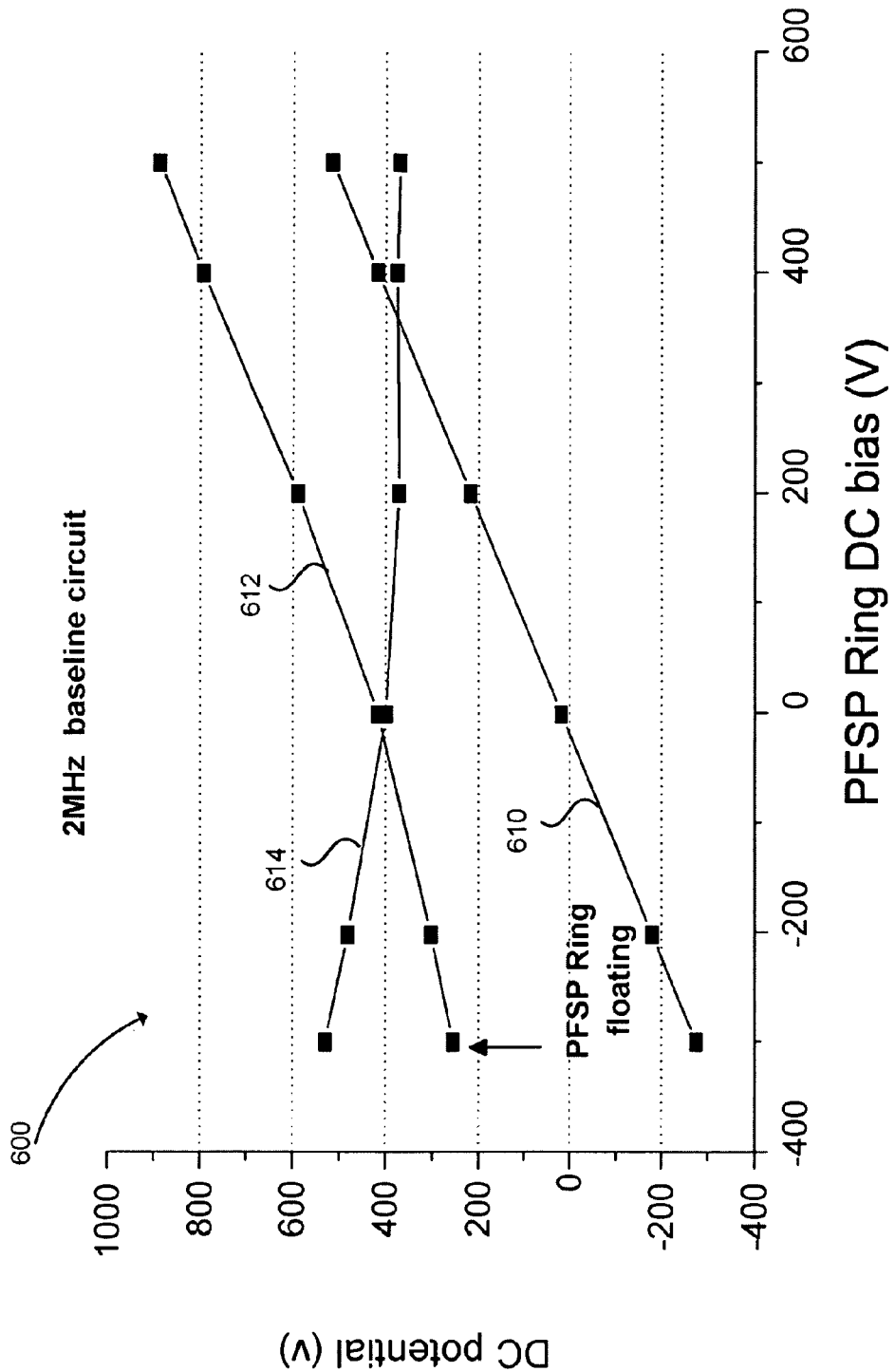
FIG. 6 shows, in accordance with an embodiment of the invention, a graph representing data of the modeled DC potential results as a function of the PFSP ring DC potential for a 2 MHz baseline circuit.

FIG. 6 shows, in accordance with an embodiment of the invention, a graph 600 representing data of the modeled DC potential results as a function of the PFSP ring DC potential for a 2 MHz baseline circuit.

The vertical axis shows modeled DC potential in voltage (V). The horizontal axis shows different DC bias voltage (V) settings on the PFSP ring. Three plot lines 610, 612, and 614 are shown as examples. Plot line 610 shows an example of the substrate DC bias, $V_{dc}$. Plot line 612 shows an example of the plasma potential $V_{pl}$. Plot line 614 shows an example of the mean ion energy at the substrate, $E_{mean}$.

Plot line 614 shows analytical result from a circuit model predicting direct control of mean ion energy at the substrate by DC potential for 2 MHz excitation frequency from floating to ground and up to about 200 V. Above the limit, the model predicts a leveling effect of the mean ion energy. The limit on DC potential affecting mean ion energy may be due to the plasma potential. Furthermore, the model predicts substrate DC bias, i.e., plot line 610, and plasma potential, i.e., plot line 612, results track with the PFSP DC potential over the full range. The model predictions show results in FIG. 6 which are in substantial agreement with measured results in FIG. 3.

Figure 7:
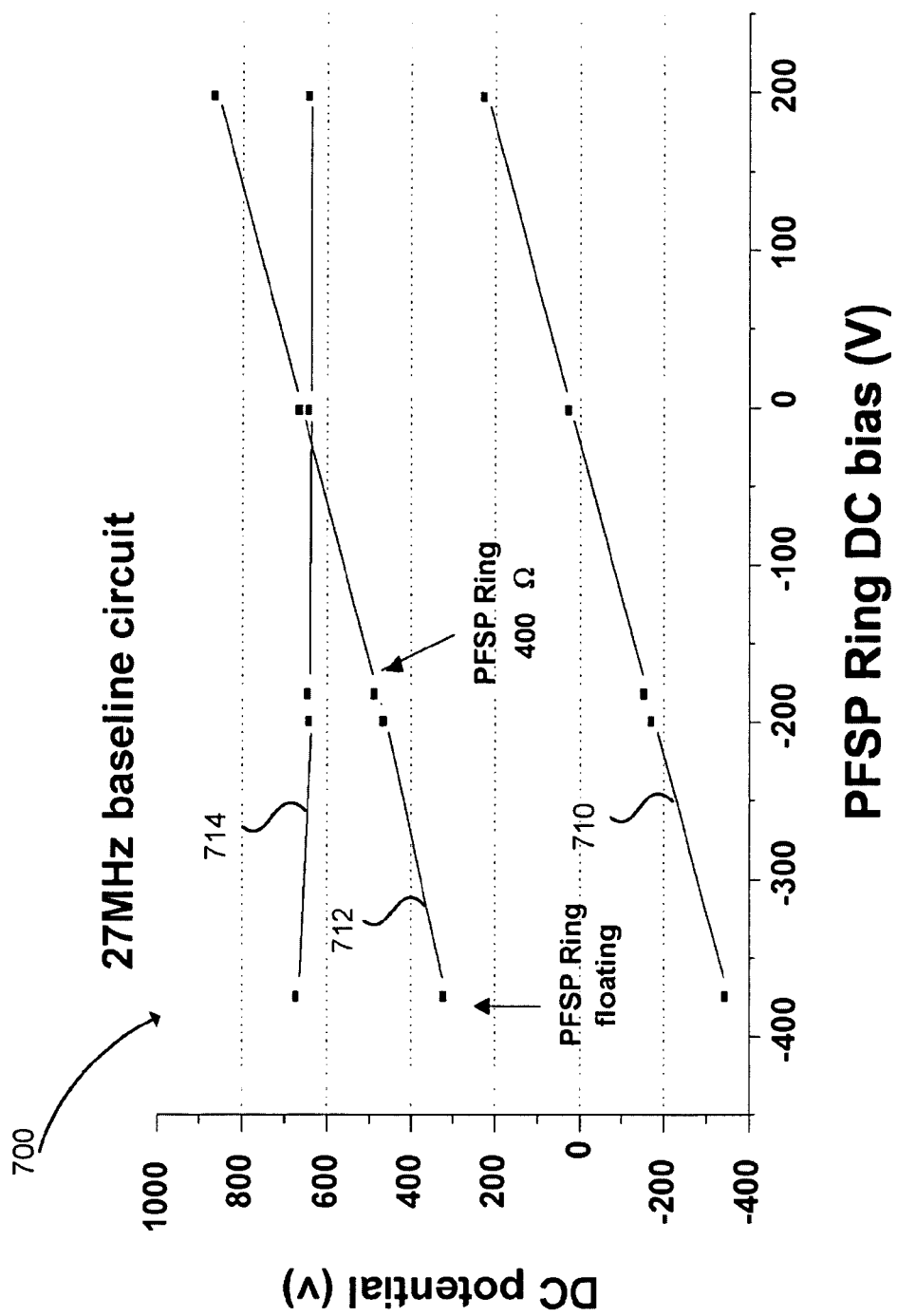
FIG. 7 shows, in accordance with an embodiment of the invention, a graph representing data of the modeled DC potential results as a function of PFSP DC potential for a 27 MHz baseline circuit.

FIG. 7 shows, in accordance with an embodiment of the invention, a graph 700 representing data of the modeled DC potential results as a function of PFSP DC potential for a 27 MHz baseline circuit.

The vertical axis shows modeled DC potential in voltage (V). The horizontal axis of shows different DC bias voltage (V) settings on the PFSP ring. Three plots lines (710, 712, and 714) are shown on graph 700. Plot line 710 shows an example of the substrate DC bias, $V_{dc}$. Plot line 712 shows an example the plasma potential $V_{pl}$. Plot line 714 shows an example of the mean ion energy at the substrate, $E_{mean}$.

Plot line 714 shows analytical result from a circuit model predicting no direct control of mean ion energy at the substrate by DC potential for 27 MHz excitation frequency over the full range. However, the model predicts substrate DC bias, i.e., plot line 710, and plasma potential, i.e., plot line 712, results track with the PFSP DC potential over the full range.

In an embodiment, the circuit model prediction shows the substrate DC bias and the plasma potential results track with PFSP DC potential over the full range for both low RF frequency and high RF frequency. However, the decrease in mean ion energy at the substrate as a function or PFSP DC potential is mainly due to the contribution from the low frequency excitation, e.g., 2 MHz. Thus, the measured results showing control of mean ion energy from FIG. 3 with dual frequencies RF power, i.e., 2 and 27 MHz, are mainly due to the low frequency (e.g., 2 MHz) contribution.

Figure 8:
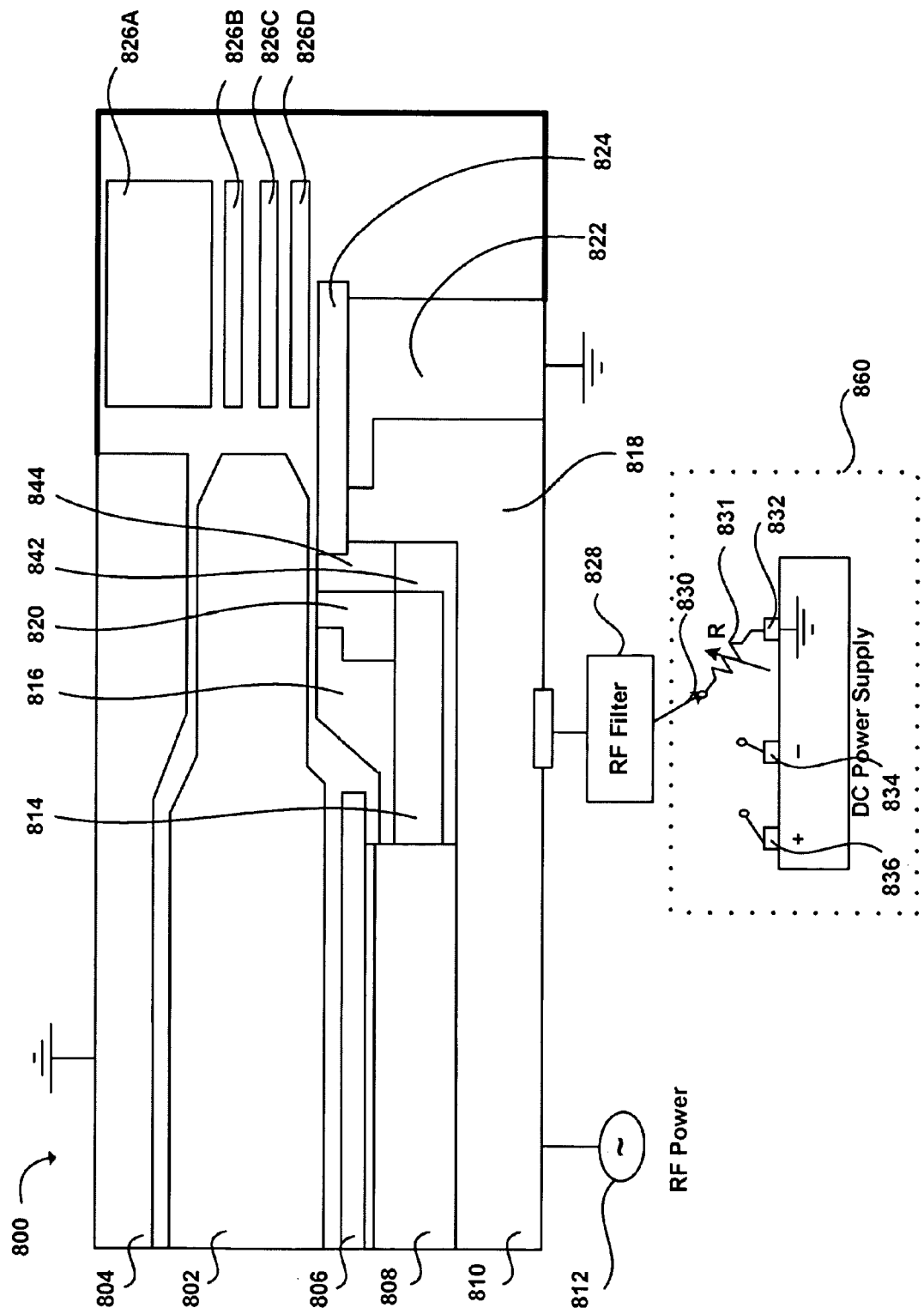
FIG. 8 shows, in an embodiment of the invention a multi-frequency capacitively coupled plasma processing system 800 configured with components designed to enhance control over the plasma processing system.

In addition to the aforementioned methods and arrangements as discussed in FIGS. 1, 2A and 2B, other embodiments may be provided in which a PFSP ring, not limited to a hot edge ring, may be employed to create a DC path from the upper electrode to the DC control module. FIG. 8 shows, in an embodiment of the invention, a multi-frequency capacitively coupled plasma processing system 800 configured with components designed to enhance control over the plasma processing system. Plasma processing system 800 may be configured to include a grounded upper electrode 804, a substrate 806, an electrostatic chuck 808, a lower body 810, an RF power source 812, a quartz coupling ring 814, a hot edge ring 816, a cover ring 820, bottom insulator 818, a bottom ground extension 822, a cover ring 824, a plurality of confinement rings (826A, 826B, 826C, and 826D), an RF filter 828, a DC control module 860, a switch 830, a variable resistor 831, an external DC ground 832, an external negative DC bias 834, and an external positive DC bias 836.

Consider the situation wherein, for example, a manufacturer wants to enhance control of plasma processing parameters (such as voltage potentials, plasma density, and the likes) without eliminating elements from the prior art capacitively coupled plasma processing system, such as hot edge ring 816 and a quartz coupling ring 814. In an embodiment, a DC conductive coupling ring 842 and a PFSP ring 844 are added to provide a DC conductive path. In an example, coupling ring 842 may provide a conductive path that may enable a current to traverse from upper electrode 804, through plasma 802, through PFSP ring 844, through lower body 810, through RF filter 828 to DC control module 860. DC conductive coupling ring 842 may be made out of aluminum and PFSP ring 844 may be made out of silicon. Thus, the addition of conductive coupling ring 842 and PFSP ring 844 may provide manufacturers an alternative implementation to control ion energy and/or plasma density by using external DC power without sacrificing process uniformity near the edge of the substrate.

As may be appreciated from the foregoing embodiments, a plasma processing system may be transformed to provide enhanced controls of plasma processing parameters. Accordingly, the manufacturing company may be able be better positioned in a highly competitive market by being able to expand substrate processing outside of the traditional plasma processing regime of mechanically confined and highly asymmetrical capacitively-coupled plasma processing system. In addition, the cost of ownership to the manufacturing company is minimized since implementation of the new components is fairly simple and inexpensive.

While this invention has been described in terms of several preferred embodiments, there are alterations, permutations, and equivalents, which fall within the scope of this invention. Also, the title, summary, and abstract are provided herein for convenience and should not be used to construe the scope of the claims herein. It should also be noted that there are many alternative ways of implementing the methods and apparatuses of the present invention. Although various examples are provided herein, it is intended that these examples be illustrative and not limiting with respect to the invention. It is therefore intended that the following appended claims be interpreted as including all such alterations, permutations, and equivalents as fall within the true spirit and scope of the present invention.

What is claimed is:

1. A method for processing a substrate in a plasma processing chamber, the method comprising:
providing an upper electrode, a lower electrode, an edge ring concentrically surrounding at least a portion of said lower electrode, and a conductive coupling ring formed of a direct current (DC) conductive material and disposed in the lower electrode below said edge ring;
configuring at least one radio frequency (RF) power source to ignite plasma between said upper electrode and said lower electrode to process said substrate when said substrate is disposed above said lower electrode;
using said conductive coupling ring to provide a conductive path that is coupled to at least said plasma, wherein said edge ring substantially covers and protects said conductive coupling ring from said plasma;
electrically coupling a DC control module via the lower electrode to the conductive coupling ring; and
switching, while the plasma is ignited in the plasma processing chamber, the electrical coupling from being open to a DC ground through an RF filter and a variable resistor, said conductive coupling ring causing setting of a DC bias voltage of the substrate, the switching causing a decrease in mean ion energy of said plasma at said substrate and, while the plasma is ignited, further decreasing the mean ion energy of said plasma at said substrate by increasing said DC bias voltage by adjusting the variable resistor,
wherein the conductive coupling ring disposed in the lower electrode below the edge ring enables current to traverse from the upper electrode, through the plasma when present, through the conductive coupling ring and to the DC control module that is connected to the lower electrode.

2. The method of claim 1, wherein said conductive coupling ring is made of aluminum.

3. The method of claim 1, wherein said RF power source has an RF frequency of about 2 MHz.

4. The method of claim 1, wherein said RF power source has an RF frequency of about 27 MHz.

5. The method of claim 1, wherein said RF power source has an RF frequency of about 60 MHz.

6. The method of claim 1, wherein said plasma processing system is a capacitively-coupled plasma processing system.

7. The method of claim 1, further comprising, during said processing said substrate, opening a switch between said RF filter and said DC ground to cause said substrate to have a negative DC bias voltage.

8. The method of claim 1 further comprising closing a switch between said RF filter and said DC ground to increase a DC bias voltage of said substrate.

9. The method of claim 1 further comprising closing a switch between said RF filter and said DC ground to increase a voltage potential of said plasma.

10. The method of claim 1 further comprising, during said processing said substrate, closing a switch between said RF filter and said DC ground to increase density of said plasma across said substrate.

11. A method for processing a substrate in a plasma processing chamber, the method comprising:
providing an upper electrode, a lower electrode, an edge ring concentrically surrounding at least a portion of said lower electrode, and a conductive coupling ring formed of a direct current (DC) conductive material and disposed in the lower electrode below said edge ring;
configuring at least one radio frequency (RF) power source to ignite plasma between said upper electrode and said lower electrode to process said substrate when said substrate is disposed above said lower electrode;
using said conductive coupling ring disposed in the lower electrode to provide a conductive path from said upper electrode through said plasma, when present, through said conductive coupling ring and to a DC control module that is coupled to said lower electrode, the conductive path initially being electrically floating;
coupling the conductive path to DC ground from the floating state via a switch of said DC control module while the plasma is ignited, the conductive path being via an RF filter and a variable resistor of said DC control module; and
adjusting, while the plasma is ignited, the variable resistor to increase a DC bias voltage of the substrate via the conductive path, the increase in DC bias voltage causing a decrease in mean ion energy of said plasma at the substrate.

12. The method of claim 11, wherein said conductive coupling ring is made of aluminum.

13. The method of claim 11, wherein said RF power source has an RF frequency of about 2 MHz.

14. The method of claim 11, wherein said RF power source has an RF frequency of about 27 MHz.

15. The method of claim 11, wherein said RF power source has an RF frequency of about 60 MHz.

16. The method of claim 11, wherein said plasma processing system is a capacitively-coupled plasma processing system.

17. The method of claim 11, further comprising, during said processing said substrate, opening a switch between said RF filter and said DC ground to cause said substrate to have a negative DC bias voltage.

18. The method of claim 11 further comprising closing a switch between said RF filter and said DC ground to increase a DC bias voltage of said substrate.

19. The method of claim 11 further comprising closing a switch between said RF filter and said DC ground to increase a voltage potential of said plasma.

20. The method of claim 11 further comprising, during said processing said substrate, closing a switch between said RF filter and said DC ground to increase density of said plasma across said substrate.

* * * * *